United States Patent
Lee et al.

(10) Patent No.: US 9,443,916 B2
(45) Date of Patent: Sep. 13, 2016

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: Sehee Lee, Paju-si (KR); Kwansoo Kim, Paju-si (KR); Sungil Bae, Goyang-si (KR); Sangdae Kim, Paju-si (KR); Sangkyoung Moon, Ulsan (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/744,389

(22) Filed: Jun. 19, 2015

(65) Prior Publication Data
US 2015/0372063 A1   Dec. 24, 2015

(30) Foreign Application Priority Data
Jun. 20, 2014   (KR) .................. 10-2014-0075520

(51) Int. Cl.
*H01L 29/08*   (2006.01)
*H01L 27/32*   (2006.01)
*H01L 51/50*   (2006.01)

(52) U.S. Cl.
CPC ....... *H01L 27/3246* (2013.01); *H01L 51/5012* (2013.01); *H01L 2227/323* (2013.01)

(58) Field of Classification Search
CPC ........... H01L 27/3262; H01L 27/3216; H01L 51/5092; H01L 51/5206; H01L 51/5221
See application file for complete search history.

(56) References Cited

U.S. PATENT DOCUMENTS

| | | | |
|---|---|---|---|
| 2003/0122140 A1* | 7/2003 | Yamazaki | H01L 21/67207 257/88 |
| 2003/0183830 A1* | 10/2003 | Yamazaki | H01L 27/3258 257/90 |
| 2007/0001586 A1* | 1/2007 | Ryu | H01L 51/5221 313/503 |
| 2007/0278940 A1* | 12/2007 | Nshikawa | H01L 27/3211 313/504 |
| 2009/0309109 A1* | 12/2009 | Chang | H01L 27/3211 257/89 |
| 2013/0161595 A1* | 6/2013 | Kim | H01L 27/3216 257/40 |

* cited by examiner

*Primary Examiner* — A. Sefer
(74) *Attorney, Agent, or Firm* — Birch, Stewart, Kolasch & Birch, LLP

(57) ABSTRACT

An organic light emitting display (OLED) device, and a method of manufacturing the OLED device are discussed. The OLED device according to one embodiment includes a substrate; a first pixel electrode, a second pixel electrode, and a third pixel electrode formed on the substrate; a first bank layer and a second bank layer formed on the substrate; and a first organic light emitting layer, a second organic light emitting layer, and a third organic light emitting layer formed on the first pixel electrode, the second pixel electrode, and the third pixel electrode, respectively. The first organic light emitting layer overlaps the second organic light emitting layer on the first bank layer.

20 Claims, 7 Drawing Sheets

ORGANIC LIGHT EMITTING DISPLAY DEVICE AND METHOD FOR MANUFACTURING THE SAME

CROSS-REFERENCE TO RELATED APPLICATIONS

This application claims the priority of Korean Patent Application No. 2014-0075520 filed on Jun. 20, 2014, in the Korean Intellectual Property Office, the entire contents of which are incorporated herein by reference.

BACKGROUND

1. Field of the Invention

The present invention relates to an organic light emitting display device and a method for manufacturing the same. The organic light emitting display device has high resolution compared to other organic light emitting display devices with a same size of area.

2. Description of the Related Art

An organic light emitting display device (OLED) is a self-light emitting display device that does not need a separate light source such as a backlight for a liquid crystal display (LCD). Thus, the OLED can be manufactured in a lightweight and thin form. Further, the OLED is efficient in terms of power consumption because the OLED is driven with a low voltage. Also, the OLED has an excellent color expression ability, a high response speed, a wide viewing angle, and a high contrast ratio (CR).

The organic light emitting display device is generally manufactured by forming organic light emitting layers that emit a red light, a green light, and a blue light in respective sub-pixel areas. To be more specific, the organic light emitting display device is manufactured by forming organic light emitting layers configured to emit a red light, a green light and a blue light, in red, green and blue sub-pixel areas, respectively. A patterned mask with plural opening areas is used to form each organic light emitting layer. To be specific, plural organic light emitting layers are respectively formed in plural sub-pixel areas by aligning the patterned mask on a substrate and depositing materials for organic light emitting layers through the opening areas of the patterned mask.

To achieve high resolution in an organic light emitting display device of the same size of area, a size of each sub-pixel area must be reduced or a gap between plural sub-pixel areas must be reduced. However, if a size of each sub-pixel area is reduced, the size of a light emitting area of the organic light emitting display device is reduced. Thus, an opening ratio of the organic light emitting display device is remarkably reduced.

If a gap between plural sub-pixel areas is reduced while maintaining a size of each sub-pixel area, the possibility of forming an organic light emitting layer in an unintended area is increased due to misalignment between a patterned mask and a substrate. Thus, the possibility of manufacturing a defective organic light emitting display device is also increased.

SUMMARY

Accordingly, an object of the present invention is to provide an organic light emitting display device of a new structure which can achieve a high resolution with a display having a large size of area, and a method for manufacturing the same. Another object of the present invention is to provide an organic light emitting display device with a low possibility of being manufactured with a defect caused by misalignment of a patterned mask, and a method for manufacturing the same. The objects of the present invention are not limited to the aforementioned objects, and other objects, which are not mentioned above, will be apparent to a person having ordinary skill in the art from the following description.

According to an embodiment of the present invention to achieve the above-described objects, an organic light emitting display device includes a substrate; a first pixel electrode, a second pixel electrode, and a third pixel electrode formed on the substrate; a first bank layer and a second bank layer formed on the substrate; and a first organic light emitting layer, a second organic light emitting layer, and a third organic light emitting layer formed on the first pixel electrode, the second pixel electrode, and the third pixel electrode, respectively. The first organic light emitting layer overlaps the second organic light emitting layer on the first bank layer.

According to another feature of the embodiment of the present invention, the first organic light emitting layer overlaps the third organic light emitting layer on the second bank layer.

According to still another feature of the embodiment of the present invention, the first pixel electrode and the second pixel electrode correspond to a first sub-pixel area and a second sub-pixel area respectively, and the first organic light emitting layer overlaps the second organic light emitting layer in a first bank area corresponding to the first bank layer.

According to still another feature of the embodiment of the present invention, the first organic light emitting layer overlapping the second organic light emitting layer on the first bank layer emits light of a shorter wavelength than light emitted by the second organic light emitting layer.

According to still another feature of the embodiment of the present invention, the first organic light emitting layer overlapping the second organic light emitting layer on the first bank layer emits light of a longer wavelength than light emitted by the second organic light emitting layer.

According to still another feature of the embodiment of the present invention, on the first bank layer, the first organic light emitting layer is under the second organic light emitting layer.

According to still another feature of the embodiment of the present invention, the first pixel electrode, the second pixel electrode, and the third pixel electrode are in a first sub-pixel area, a second sub-pixel area, and a third sub-pixel area, respectively, the first bank layer and the second bank layer are in a first bank area and a second bank area, respectively, the first organic light emitting layer overlaps the second organic light emitting layer in the first bank area, and the first organic light emitting layer overlaps the third organic light emitting layer in the second bank area.

According to still another feature of the embodiment of the present invention, in the first bank area, the first organic light emitting layer is under the second organic light emitting layer, and, in the second bank area, the first organic light emitting layer is under the third organic light emitting layer.

According to another feature of the embodiment of the present invention, in the first bank area, the first organic light emitting layer is between the second organic light emitting layer and the first bank layer, and, in the second bank area, the first organic light emitting layer is between the third organic light emitting layer and the second bank layer.

According to still another feature of the embodiment of the present invention, each of the first sub-pixel area, the second sub-pixel area, and the third sub-pixel area emits any one of a red light, a green light, and a blue light.

According to still another feature of the embodiment of the present invention, a fourth pixel electrode formed on the substrate, the first pixel electrode, the second pixel electrode, the third pixel electrode, and the fourth pixel electrode are in a first sub-pixel area, a second sub-pixel area, a third sub-pixel area, and a fourth sub-pixel area, respectively, and the fourth sub-pixel area is configured to emit a light of a same color as the second sub-pixel area.

According to still another feature of the embodiment of the present invention, a third bank area configured to separate the third and fourth sub-pixel areas, the fourth organic light emitting layer is disposed in an entirety of the fourth sub-pixel area and the third bank area.

According to another embodiment of the present invention to achieve the above-described objects, an organic light emitting display (OLED) device includes a plurality of sub-pixels; and an organic light emitting layer in each of the plurality of sub-pixels, organic light emitting layers respectively corresponding to two adjacent sub-pixels form an overlap on a bank layer located between the two adjacent sub-pixels to separate the two adjacent sub-pixels and minimize emission energy differences between the two adjacent sub-pixels or adjacent pixels that respectively include the two adjacent sub-pixels.

According to another feature of the another embodiment of the present invention, the overlap includes a first of the organic light emitting layers having a shorter wavelength on top of a second of the organic light emitting layers having a longer wavelength.

According to still another feature of the another embodiment of the present invention, a length of the overlap depends on at least one of panel resolution, pixel pitch, pixel size, aperture ratio, and process variation.

According to another embodiment of the present invention to achieve the above-described objects, a method of manufacturing an organic light emitting display (OLED) device includes forming a first pixel electrode, a second pixel electrode, and a third pixel electrode on a substrate; forming a first bank layer and a second bank layer on the substrate; and forming a first organic light emitting layer, a second organic light emitting layer, and a third organic light emitting layer on the first pixel electrode, the second pixel electrode, and the third pixel electrode, respectively. The first organic light emitting layer overlaps the second organic light emitting layer on the first bank layer.

According to another feature of the another embodiment of the present invention, the first organic light emitting layer overlaps the third organic light emitting layer on the second bank layer.

According to still another feature of the another embodiment of the present invention, the first organic light emitting layer overlapping the second organic light emitting layer on the first bank layer emits light of a shorter wavelength than light emitted by the second organic light emitting layer.

According to still another feature of the another embodiment of the present invention, on the first bank layer, the first organic light emitting layer is under the second organic light emitting layer.

According to still another feature of the another embodiment of the present invention, the first pixel electrode, the second pixel electrode, and the third pixel electrode are in a first sub-pixel area, a second sub-pixel area, and a third sub-pixel area, respectively, the first bank layer and the second bank layer are in a first bank area and a second bank area, respectively, the first organic light emitting layer overlaps the second organic light emitting layer in the first bank area, and the first organic light emitting layer overlaps the third organic light emitting layer in the second bank area.

The details of other embodiments will be included in the detailed description of the invention and the accompanying drawings. The present invention has an effect of manufacturing an organic light emitting display device with high resolution by reducing a width of a bank area between plural sub-pixel areas. The present invention has another effect of minimizing a defect in an organic light emitting display device caused by a patterned mask that is misaligned from a predetermined position. The effects of the present invention are not limited to the aforementioned effects, and other effects, which are not mentioned above, will be apparent to a person having ordinary skill in the art from the following description.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
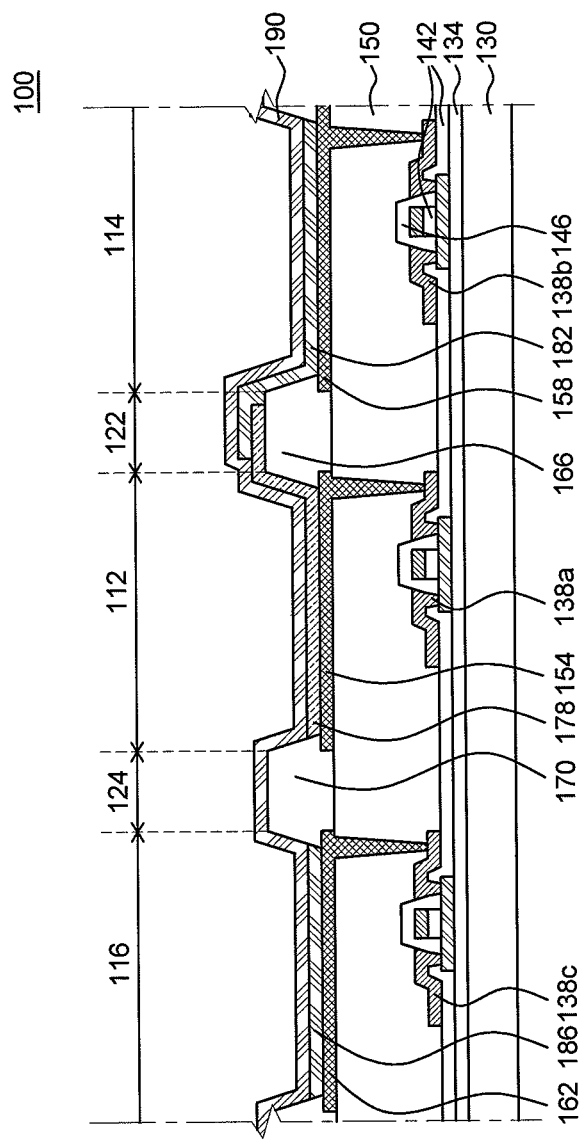
FIG. 1 is a schematic plan view of an organic light emitting display device according to an embodiment of the present invention.

Advantages and features of the present invention, and methods for accomplishing the same will be more clearly understood from embodiments described below with reference to the accompanying drawings. However, the present invention is not limited to the following embodiments and can be implemented in various different forms. The embodiments are provided only to completely describe the present invention and fully convey a scope of the invention to a person having ordinary skill in the art to which the present invention pertains within a category of the invention. The present invention will be defined by the appended claims.

The shapes, sizes, ratios, angles, numbers, and the like illustrated in the accompanying drawings for describing the embodiments of the present invention are merely examples, and the present invention is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," "containing," and "consist of" used herein are generally intended to allow other components to be added unless the terms are used with the term "only". Any references to singular can include plural unless expressly stated otherwise.

Components are interpreted to include an ordinary error range even if not expressly stated. When the position relation between two parts is described using the terms, for example, such as "on", "above", "below", and "next", one or more parts may be positioned between the two parts unless the terms are used with the term "immediately" or "directly" is not used. When an element or layer is referred to as being "on" another element or layer, it may be directly on the other element or layer, or intervening elements or layers may be present. Although the terms "first", "second", and the like are used for describing various components, these components are not confined by these terms. These terms are merely used for distinguishing one component from the other components. Therefore, a first component to be mentioned below can be a second component in a technical concept of the present invention.

Throughout the whole specification, the same reference numerals denote the same elements wherever possible. Since size and thickness of each component illustrated in the drawings are represented for convenience in explanation, the present invention is not necessarily limited to the illustrated size and thickness of each component. The features of various embodiments of the present invention can be partially or entirely bonded to or combined with each other and can be interlocked and operated in technically various ways as can be fully understood by a person having ordinary skill in the art, and the embodiments can be carried out independently of or in association with each other. Various embodiments of the present invention will be described in detail with reference to the accompanying drawings.

FIG. 1 is a schematic plan view of an organic light emitting display device according to an embodiment of the present invention. An organic light emitting display device 100 can include a first sub-pixel area 112, a second sub-pixel area 114, a third sub-pixel area 116, a first bank area 122, a second bank area 124, a substrate 130, a buffer layer 134, thin film transistors 138a, 138b, and 138c, a gate insulating layer 142, an inter-layer dielectric layer 146, an overcoating/ layer 150, a first pixel electrode 154, a second pixel electrode 158, a third pixel electrode 162, a first bank layer 166, a second bank layer 170, a first organic light emitting layer 178, a second organic light emitting layer 182, a third organic light emitting layer 186, and a common electrode 190. The organic light emitting display device 100 is a top-emission organic light emitting display device (refer to FIG. 1).

The organic light emitting display device 100 can include the first sub-pixel area 112, the second sub-pixel area 114, and the third sub-pixel area 116 as areas for displaying colors (refer to FIG. 1). The first sub-pixel area 112, the second sub-pixel area 114, and the third sub-pixel area 116 can emit light of different colors, respectively. In particular, the first sub-pixel area 112, the second sub-pixel area 114, and the third sub-pixel area 116 emit any one of a red light, a green light, and a blue light.

The organic light emitting display device 100 can include the plural bank areas 122 and 124 configured to separate the plural sub-pixel areas 112, 114, and 116 (refer to FIG. 1). To be specific, the organic light emitting display device 100 can include the first bank area 122 configured to separate the first sub-pixel area 112 and the second sub-pixel area 114. The second bank area 124 is configured to separate the first sub-pixel area 112 and the third sub-pixel area 116. The first bank area 122 and the second bank area 124 are designed so as not to emit light.

The substrate 130 is a solid substance for supporting various elements of the organic light emitting display device 100. The substrate 130 can be formed of a material having transparency and flexibility. The buffer layer 134 can be formed on the substrate 130. The buffer layer 134 prevents infiltration of moisture or impurities through the substrate 130 and flattens an upper part of the substrate 130. However, the buffer layer 134 is not an essential component. Whether or not the buffer layer 134 is formed can be determined on the basis of a kind of the substrate 130 or a kind of the thin film transistor 138 used in the organic light emitting display device 100. Further, the buffer layer 134 can be formed of a transparent material.

The thin film transistors 138a, 138b, and 138c are connected to the first pixel electrode 154, the second pixel electrode 158, and the third pixel electrode 162, respectively, to drive the organic light emitting display device 100. The thin film transistors 138a, 138b, and 138c can include an active layer formed on the buffer layer 134, gate electrodes formed on the gate insulating layer 142, and source electrodes and drain electrodes formed on the inter-layer dielectric layer 146.

The overcoating layer 150 can be formed on the thin film transistors 138a, 138b, and 138c. The overcoating layer 150 is a layer configured to flatten the upper part of the substrate 130. Namely, the overcoating layer 150 functions as a flattening layer. The overcoating layer 150 can include contact holes for electrically connecting the source electrodes of the thin film transistors 138a, 138b, and 138c with the first pixel electrode 154, the second pixel electrode 158, and the third pixel electrode 162, respectively.

The first pixel electrode 154, the second pixel electrode 158, and the third pixel electrode 162 are disposed on the substrate 110 and are configured to apply voltages to the first organic light emitting layer 178, the second organic light emitting layer 182, and the third organic light emitting layer 186, respectively. The first pixel electrode 154, the second pixel electrode 158, and the third pixel electrode 162 are separately formed in the respective sub-pixel areas (refer to FIG. 1). To be specific, the first pixel electrode 154 can be disposed in the first sub-pixel area 112, the second pixel electrode 158 can be disposed in the second sub-pixel area 114, and the third pixel electrode 162 can be disposed in the third sub-pixel area 116. Each of the first pixel electrode 154, the second pixel electrode 158, and the third pixel electrode 162 can be an anode or a cathode. In this regard, if the first pixel electrode 154, the second pixel electrode 158, and the third pixel electrode 162 are anodes, the common electrode 180 to be described later can be a cathode. If the first pixel electrode 154, the second pixel electrode 158, and the third pixel electrode 162 are cathodes, the common electrode 180 can be an anode. In the following detailed description, the first pixel electrode 154, the second pixel electrode 158, and the third pixel electrode 162 will be assumed as anodes.

Each of the first pixel electrode 154, the second pixel electrode 158, and the third pixel electrode 162 can be an anode formed of a transparent conductive material having a high work function value. For example, the first pixel electrode 154, the second pixel electrode 158, and the third pixel electrode 162 can be formed of indium tin oxide (ITO), indium zinc oxide (IZO), and indium tin zinc oxide (ITZO), respectively. If the organic light emitting display device 100 is a top-emission organic light emitting display device, the first pixel electrode 154, the second pixel electrode 158, and the third pixel electrode 162 can further include reflective layers (refer to FIG. 1).

The first bank layer 166 and the second bank layer 170 can be formed on edges of each of the first pixel electrode 154, the second pixel electrode 158, and the third pixel electrode 162. In particular, the first bank layer 166 can be formed to cover an edge of the first pixel electrode 154 and an edge of the second pixel electrode 158 (refer to FIG. 1). The second bank layer 170 can be formed to cover an edge of the first pixel electrode 154 and an edge of the third pixel electrode 162. Thus, the first bank layer 166 can be disposed in the first bank area 122, and the second bank layer 170 can be disposed in the second bank area 124 (refer to FIG. 1). Each of the first bank layer 166 and the second bank layer 170 can be formed of an organic insulating material, for example, such as any one of polyimide, photo acryl, and benzocyclobutene (BCB), or a black material such as a black resin.

The first organic light emitting layer 178 is formed on the first pixel electrode 154, the second organic light emitting layer 182 is formed on the second pixel electrode 158, and the third organic light emitting layer 186 is formed on the third pixel electrode 162. Herein, the first organic light emitting layer 178 is formed only on the first pixel electrode 154 among the first pixel electrode 154, the second pixel electrode 158, and the third pixel electrode 162. The second organic light emitting layer 182 is formed only on the second pixel electrode 158, and the third organic light emitting layer 186 is formed only on the third pixel electrode 162. In other words, two or more of the first organic light emitting layer 178, the second organic light emitting layer 182, and the third organic light emitting layer 186 are disposed so as not to overlap each of the first sub-pixel area 112, the second sub-pixel area 114, and the third sub-pixel area 116. The first organic light emitting layer 178, the second organic light emitting layer 182, and the third organic light emitting layer 186 can emit light of different colors respectively. Namely, the first organic light emitting layer 178, the second organic light emitting layer 182, and the third organic light emitting layer 186 emit any one of a red light, a green light, and a blue light.

Two of the first organic light emitting layer 178, the second organic light emitting layer 182, and the third organic light emitting layer 186 overlap on one or more of the first bank layer 166 and the second bank layer 170. For example, the first organic light emitting layer 178 and the second organic light emitting layer 182 can overlap on the first bank layer 166 (refer to FIG. 1). In order for the first organic light emitting layer 178 and the second organic light emitting layer 182 to overlap on the first bank layer 166, the first organic light emitting layer 178 is disposed in an entirety of the first sub-pixel area 112 that emits a light and the first bank area 122 that does not emit a light (refer to FIG. 1). Likewise, the second organic light emitting layer 182 is disposed in an entirety of the second sub-pixel area 114 that emits a light and the first bank area 122 that does not emit a light (refer to FIG. 1). In particular, referring to FIG. 1, on the first bank layer 166, the first organic light emitting layer 178 is under the second organic light emitting layer 182.

The common electrode 190 is formed on the first organic light emitting layer 178, the second organic light emitting layer 182, and the third organic light emitting layer 186. The common electrode 190 is disposed to face the first pixel electrode 154, the second pixel electrode 158, and the third pixel electrode 162. The common electrode 190 is configured to apply voltages to the first organic light emitting layer 178, the second organic light emitting layer 182, and the third organic light emitting layer 186. The common electrode 190 is connected with a separate power line and is configured to apply the same voltage to all of the sub-pixel areas. Further, the common electrode 190 can be formed to have a very small thickness and thus can be substantially transparent. The common electrode 190 can be a cathode formed of a metallic material having a low work function value, such as silver (Ag), titanium (Ti), aluminum (Al), molybdenum (Mo), or an alloy of silver (Ag) and magnesium (Mg). A person having ordinary skill in the art can readily change vertical positions of the first pixel electrode 154, the second pixel electrode 158, the third pixel electrode 162, and the common electrode 190, and, thus, in the following description, the common electrode 190 will be assumed as a cathode.

If a voltage is applied to the first pixel electrode 154 and the common electrode 190, electrons from the common electrode 190 and holes from the first pixel electrode 154 are moved in a perpendicular direction to the first organic light emitting layer 178. If a voltage is applied to the second pixel electrode 158 and the common electrode 190, electrons from the common electrode 190 and holes from the second pixel electrode 158 are moved in a perpendicular direction to the second organic light emitting layer 182. Therefore, although the first organic light emitting layer 178 and the second organic light emitting layer 182 overlap the first bank area 122, the first pixel electrode 154 and the second pixel electrode 158 are not disposed in the first bank area 122. Thus, light cannot be emitted from the first organic light emitting layer 178 and the second organic light emitting layer 182 in the first bank area 122.

In an organic light emitting display device according to related art, a first organic light emitting layer is formed only on a first pixel electrode rather than on a first bank layer. A second organic light emitting layer is formed only on a second pixel electrode rather than on the first bank layer. Thus, the first bank layer needs to have a predetermined width or a so-called process margin in consideration of misalignment of a patterned mask.

However, in the organic light emitting display device 100 according to the embodiment of the present invention, the first organic light emitting layer 178 and the second organic light emitting layer 182 overlap on the first bank layer 166. Thus, a width of the first bank layer 166 can be reduced. Therefore, the organic light emitting display device of the same size of display area can secure more sub-pixel areas. Thus, the organic light emitting display device has a high-resolution. Further, because the high-resolution organic light emitting display device is made by reducing a width of the first bank layer 166, a size of an area for forming the first organic light emitting layer 178 and the second organic light emitting layer 182 does not need to be reduced. Thus, an opening ratio to make the high-resolution organic light emitting display device can be maintained. Further, as will be described later with reference to FIG. 6A, FIG. 6B, FIG. 7A, and FIG. 7B, a problem of manufacturing a defective organic light emitting display device caused by misalignment of a mask can be minimized. The overlap on the bank has a length dimension that depends upon at least one of panel resolution, pixel pitch, pixel size, aperture ratio and process variation.

Although the second organic light emitting layer 182 is formed on the first organic light emitting layer 178 on the first bank layer 166 (refer to FIG. 1), a sequence of forming the organic light emitting layers is not important if two organic light emitting layers are formed on a single bank layer. Therefore, in some cases, the first organic light emitting layer 178 can be formed on the second organic light emitting layer 182 on the first bank layer 166.

Figure 2:
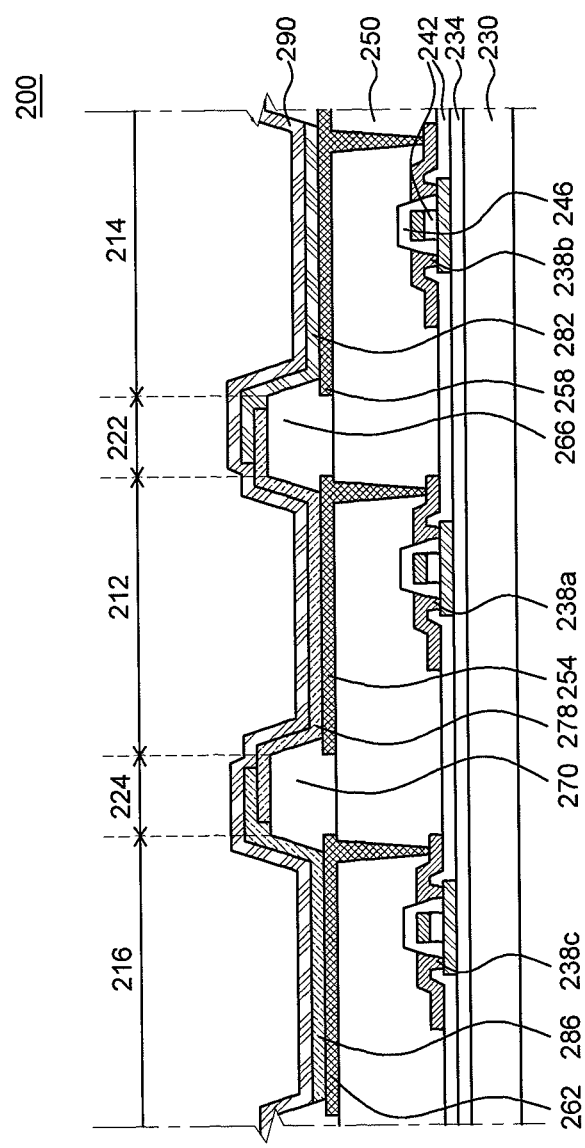
FIG. 2 is a cross-sectional view of an organic light emitting display device according to another embodiment of the present invention.

Next, FIG. 2 is a cross-sectional view of an organic light emitting display device according to another embodiment of the present invention. An organic light emitting display device 200 can include a first sub-pixel area 212, a second sub-pixel area 214, a third sub-pixel area 216, a first bank area 222, a second bank area 224, a substrate 230, a buffer layer 234, thin film transistors 238a, 238b, and 238c, a gate insulating layer 242, an inter-layer dielectric layer 246, an overcoating layer 250, a first pixel electrode 254, a second pixel electrode 258, a third pixel electrode 262, a first bank layer 266, a second bank layer 270, a first organic light emitting layer 278, a second organic light emitting layer 282, a third organic light emitting layer 286, and a common electrode 290.

The organic light emitting display device 200 illustrated in FIG. 2 is substantially the same as the organic light emitting display device 100 illustrated in FIG. 1 except the first organic light emitting layer 278 and the third organic light emitting layer 286 are disposed so as to be overlapped on the second bank layer 270, and, thus, redundant explanation thereof will be omitted.

The first organic light emitting layer 278 and the second organic light emitting layer 282 overlap the first bank layer 266 (refer to FIG. 2). Also, the first organic light emitting layer 278 and the third organic light emitting layer 286 overlap on the second bank layer 270. In order for the first organic light emitting layer 278 and the third organic light emitting layer 286 to overlap on the second bank layer 270, the first organic light emitting layer 278 is disposed in an entirety of the first sub-pixel area 212 that emits a light and the first bank area 222 and second bank area 224 that do not emit light. Further, the third organic light emitting layer 286 is disposed in an entirety of the third sub-pixel area 216 that emits a light and the second bank area 224 that does not emit a light (refer to FIG. 2). In particular, referring to FIG. 2, in the first bank area 222, the first organic light emitting layer 278 is under the second organic light emitting layer 282, and in the second bank area 224, the first organic light emitting layer 278 is under the third organic light emitting layer 286. Namely, in the first bank area 222, the first organic light emitting layer 278 is between the second organic light emitting layer 282 and the first bank layer 266, and in the second bank area 224, the first organic light emitting layer 278 is between the third organic light emitting layer 286 and the second bank layer 270.

In principle, the first pixel electrode 254 is disposed only in the first sub-pixel area 212. The second pixel electrode 258 is disposed only in the second sub-pixel area 214, and the third pixel electrode 262 is disposed only in the third sub-pixel area 216. However, parts of the first pixel electrode 254, the second pixel electrode 258, and the third pixel electrode 262 can be disposed in the first bank area 222 and the second bank area 224 due to misalignment of a patterned mask in a process. In this case, mixed color light can be emitted from the first organic light emitting layer 278 and the second organic light emitting layer 282 that are disposed to overlap the first bank area 222 or the first organic light emitting layer 278. The third organic light emitting layer 286 is disposed to overlap the second bank area 224.

To minimize emission of mixed light from the first bank area 222 and the second bank area 224 caused by misalignment of the patterned mask, a sequence of forming and arranging two organic light emitting layers in the first bank area 222 and the second bank area 224 can be specified. To be specific, an organic light emitting layer that emits a short-wavelength light of two organic light emitting layers can be disposed on the other organic light emitting layer that emits a long-wavelength light. Or an organic light emitting layer that emits a long-wavelength light of two organic light emitting layers can be disposed on the other organic light emitting layer that emits a short-wavelength light.

In other words, if an organic light emitting layer that emits a short-wavelength light of two organic light emitting layers is disposed on the other organic light emitting layer that emits a long-wavelength light on the first bank layer 266, the organic light emitting layer that emits a short-wavelength light of the two organic light emitting layers can be disposed on the other organic light emitting layer that emits a long-wavelength light on the second bank layer 270. If an organic light emitting layer that emits a long-wavelength light of two organic light emitting layers is disposed on the other organic light emitting layer that emits a short-wavelength light on the first bank layer 266, the organic light emitting layer that emits a long-wavelength light of the two organic light emitting layers can be disposed on the other organic light emitting layer that emits a short-wavelength light on the second bank layer 270. For example, if the first organic light emitting layer 278 emits a blue light of a shortest wavelength, the second organic light emitting layer 282 would emit a green light of an intermediate wavelength, and the third organic light emitting layer 286 would emit a red light of a longest wavelength. The second organic light emitting layer 282 can be formed on the first organic light emitting layer 278 on the first bank layer 266. Also, the third organic light emitting layer 286 can be formed on the first organic light emitting layer 278 of the second bank layer 270 (refer to FIG. 2).

Figure 3:
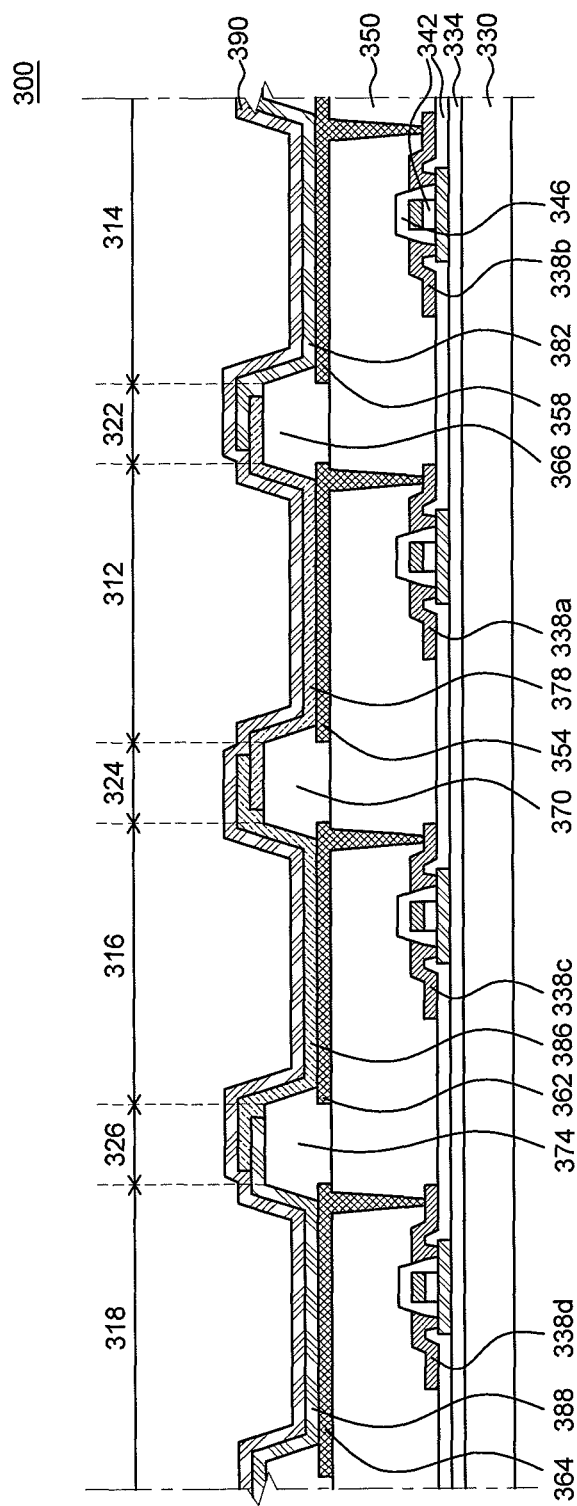
FIG. 3 is a cross-sectional view of an organic light emitting display device according to yet another embodiment of the present invention.

Next, FIG. 3 is a cross-sectional view of an organic light emitting display device according to another embodiment of the present invention. An organic light emitting display device 300 can include a first sub-pixel area 312, a second sub-pixel area 314, a third sub-pixel area 316, a fourth sub-pixel area 318, a first bank area 322, a second bank area 324, a third bank area 326, a substrate 330, a buffer layer 334, thin film transistors 338a, 338b, 338c, and 338d, a gate insulating layer 342, an inter-layer dielectric layer 346, an overcoating layer 350, a first pixel electrode 354, a second pixel electrode 358, a third pixel electrode 362, a fourth pixel electrode 364, a first bank layer 366, a second bank layer 370, a third bank layer 374, a first organic light emitting layer 378, a second organic light emitting layer 382, a third organic light emitting layer 386, a fourth organic light emitting layer 388, and a common electrode 390.

The organic light emitting display device 300 illustrated in FIG. 3 is substantially the same as the organic light emitting display device 200 illustrated in FIG. 2 except that the organic light emitting display device 300 includes the fourth sub-pixel area 318, the third bank area 326, the thin film transistor 338d, the fourth pixel electrode 364, the third bank layer 374, and the fourth organic light emitting layer 388. Thus, a redundant explanation thereof will be omitted.

The fourth pixel electrode 364 is disposed in the fourth sub-pixel area 318 (refer to FIG. 3). The thin film transistor 388d for driving the fourth pixel electrode 364 is connected with the fourth pixel electrode 364. The third bank layer 374 is disposed to cover an edge of the third pixel electrode 362 and an edge of the fourth pixel electrode 364. Further, the fourth organic light emitting layer 388 is disposed on the fourth pixel electrode 364 and in the fourth sub-pixel area 318.

The fourth sub-pixel area 318 and the second sub-pixel area 314 can emit light of the same color. In order for the fourth sub-pixel area 318 and the second sub-pixel area 314 to emit light of the same color, the fourth organic light emitting layer 388 disposed in the fourth sub-pixel area 318 can emit light of the same color as the second organic light emitting layer 382 disposed in the second sub-pixel area 314.

The first organic light emitting layer 378 and the second organic light emitting layer 382 overlap on the first bank layer 366. The first organic light emitting layer 378 and the third organic light emitting layer 386 are disposed to be overlapped on the second bank layer 370. The third organic light emitting layer 386 and the fourth organic light emitting layer 388 overlap on the third bank layer 374. In order for the third organic light emitting layer 386 and the fourth organic light emitting layer 388 to overlap on the third bank layer 374 (refer to FIG. 3), the first organic light emitting layer 378 is disposed in an entirety of the first sub-pixel area 312 that emits a light and the first bank area 322 and the second bank area 324 that do not emit light. Further, the second organic light emitting layer 382 is disposed in an entirety of the second sub-pixel area 314 that emits a light and the first bank area 322 that does not emit a light (refer to FIG. 3). Furthermore, the third organic light emitting layer 386 is disposed in an entirety of the third sub-pixel area 316 that emits a light and the second bank area 324 and the third bank area 326 that do not emit light (refer to FIG. 3). Also, the fourth organic light emitting layer 388 is disposed in an entirety of the fourth sub-pixel area 318 that emits a light and the third bank area 326 that does not emit a light (refer to FIG. 3).

Similar to the above description, to minimize emission of mixed light from the first bank area 322, the second bank area 324, and the third bank area 326 caused by misalignment of a patterned mask, a sequence of forming and arranging two organic light emitting layers in the first bank area 322, the second bank area 324, and the third bank area 326 can be specified. To be specific, on all of the first bank layer 366, the second bank layer 370 and the third bank layer 374, an organic light emitting layer that emits a short-wavelength light of two organic light emitting layers can be disposed on the other organic light emitting layer that emits a long-wavelength light. Or an organic light emitting layer that emits a long-wavelength light of two organic light emitting layers can be disposed on the other organic light emitting layer that emits a short-wavelength light.

In other words, if an organic light emitting layer that emits a short-wavelength light of two organic light emitting layers is disposed on the other organic light emitting layer that emits a long-wavelength light on the first bank layer 366, the organic light emitting layer that emits a short-wavelength light of the two organic light emitting layers can be disposed on the other organic light emitting layer that emits a long-wavelength light on the second bank layer 370 and the third bank layer 374. If an organic light emitting layer that emits a long-wavelength light of two organic light emitting layers is disposed on the other organic light emitting layer that emits a short-wavelength light on the first bank layer 366, the organic light emitting layer that emits a long-wavelength light of the two organic light emitting layers can be disposed on the other organic light emitting layer that emits a short-wavelength light on the second bank layer 370 and the third bank layer 374.

If the first organic light emitting layer 378 emits a blue light of a shortest wavelength, for example, the second organic light emitting layer 382 and the fourth organic light emitting layer 388 emit green light of an intermediate wavelength. If the third organic light emitting layer 386 emits a red light of a longest wavelength, the second organic light emitting layer 382 can be formed on the first organic light emitting layer 378 on the first bank layer 366, and the third organic light emitting layer 386 can be formed on the first organic light emitting layer 378 on the second bank layer 370. Also, the third organic light emitting layer 386 can be formed on the fourth organic light emitting layer 388 on the third bank layer 374 (refer to FIG. 3).

Figure 4:
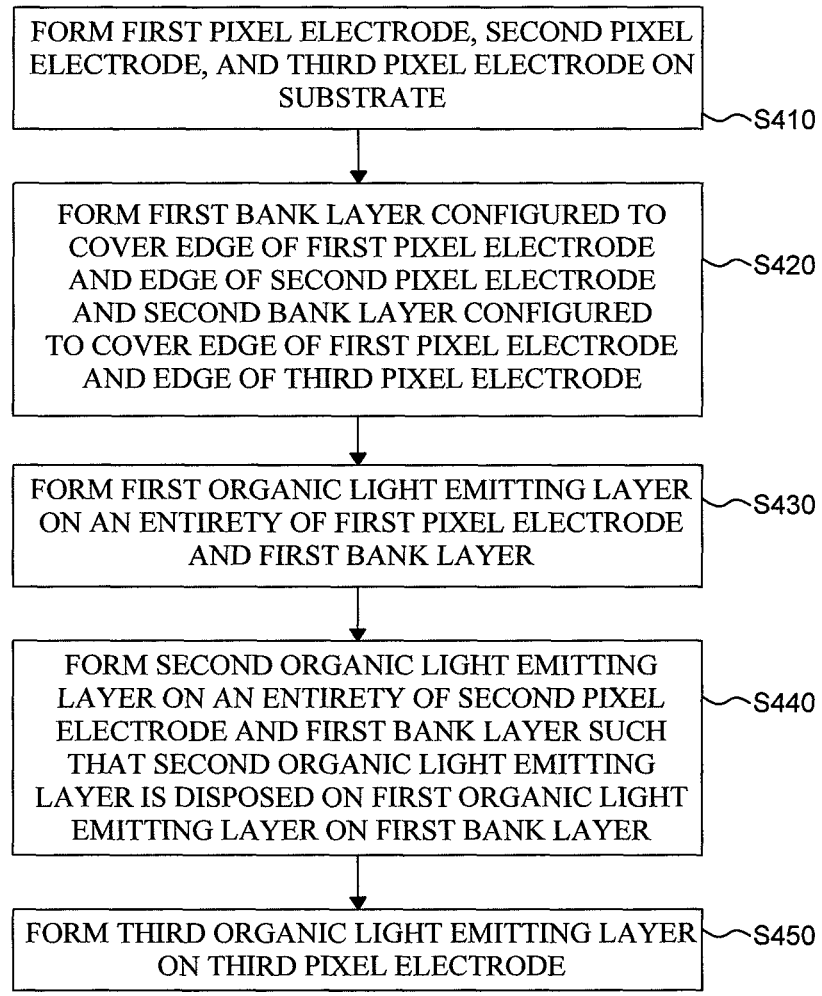
FIG. 4 is a flowchart provided to describe a method for manufacturing organic light emitting display device according to an embodiment of the present invention.

Next, FIG. 4 is a flowchart provided to describe a method for manufacturing organic light emitting display device according to an embodiment of the present invention. First, second and third pixel electrodes are formed on a substrate to be separate from each other (S410). Herein, a fourth pixel electrode can be formed on the substrate to be separate from the first, second and third pixel electrodes. The first, second, third and fourth pixel electrodes can be formed using a patterned mask.

Then, a first bank layer configured to cover edges of the first and second pixel electrodes and a second bank layer configured to cover edges of the first and third pixel electrodes are formed (S420). If the fourth pixel electrode is formed on the substrate, a third bank layer configured to edges of the third and fourth pixel electrodes can be further formed while the first bank layer and the second bank layer are formed. The first, second and third bank layers can be formed of the same material.

Then, a first organic light emitting layer is formed on an entirety of the first pixel electrode and the first bank layer (S430). Herein, the first organic light emitting layer can be formed on an entirety of the first pixel electrode, the first bank layer, and the second bank layer.

Then, a second organic light emitting layer is formed on an entirety of the second pixel electrode and the first bank layer such that the second organic light emitting layer is disposed on the first organic light emitting layer on the first bank layer (S440). Thus, the first and second organic light emitting layers are disposed to be overlapped on the first bank layer.

Figure 5:
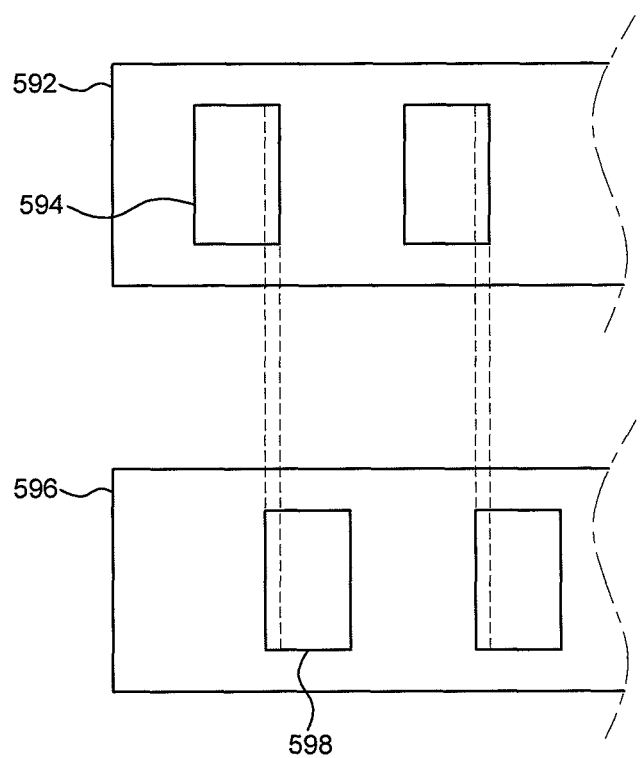
FIG. 5 is a plan view provided to exemplify a mask pattern with respect to first and second organic light emitting layers for manufacturing an organic light emitting display device according to an embodiment of the present invention.

Next, FIG. 5 is a plan view provided to exemplify a mask pattern for forming first and second organic light emitting layers for manufacturing an organic light emitting display device according to an embodiment of the present invention. An opening area 594 of a mask 592 for forming a first organic light emitting layer and an opening area 598 of a mask 596 for forming a second organic light emitting layer overlap each other.

If the fourth pixel electrode is formed on the substrate and the third bank layer configured to cover edges of the third and fourth pixel electrodes, a fourth organic light emitting layer configured to emit a light of the same color as the second organic light emitting layer can be formed on the fourth pixel electrode and the third bank layer. Also, the second organic light emitting layer is formed on the second pixel electrode and the first bank layer. The second organic light emitting layer and the fourth organic light emitting layer can be formed at the same time using the same mask. Further, the second and fourth organic light emitting layers can be formed using the same light emitting material.

Then, a third organic light emitting layer is formed on the third pixel electrode (S450) (refer to FIG. 4). The third organic light emitting layer can be formed on an entirety of the third pixel electrode and the third bank layer such that the third organic light emitting layer is disposed on the first organic light emitting layer on the second bank layer. Similar to the first and second organic light emitting layers, the third organic light emitting layer can also be formed using a patterned mask.

If the fourth pixel electrode is formed on the substrate, the third bank layer configured to cover edges of the third and fourth pixel electrodes is further formed. The fourth organic light emitting layer is formed on the fourth pixel electrode and the third bank layer. The third organic light emitting layer can be formed an entirety of on the third pixel electrode, the second bank layer, and the third bank layer such that the third organic light emitting layer is disposed on the fourth organic light emitting layer on the third bank layer.

Figure 6A:
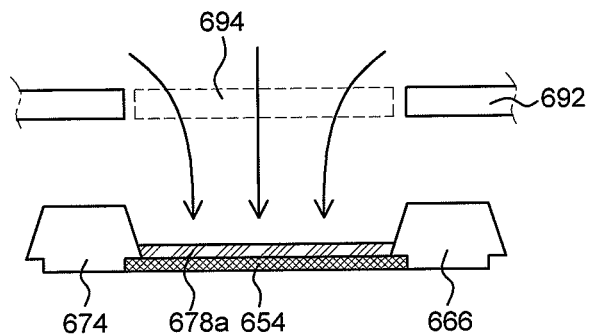
FIG. 6A and FIG. 6B are diagrams illustrating misalignment of a mask which can occur when a method for manufacturing an organic light emitting display device according to related art is used.
Figure 6B:
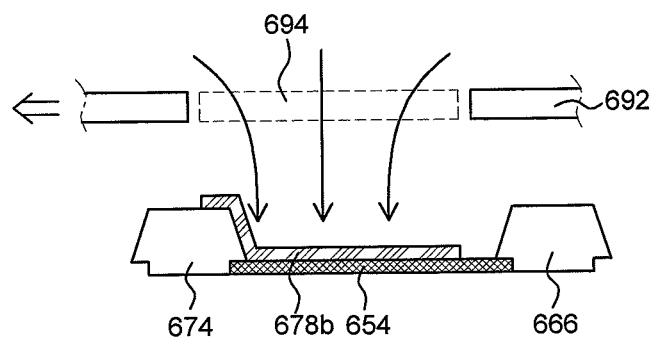

FIG. 6A and FIG. 6B are diagrams illustrating misalignment of a mask which can occur when a method for manufacturing an organic light emitting display device according to related art is used. Referring to FIG. 6A, the method for manufacturing an organic light emitting display device according to related art includes, when an opening area 694 of a mask 692 is normally aligned, forming a first organic light emitting layer 678a between a first bank layer 666 and a third bank layer 674 and on a first pixel electrode 654.

However, referring to FIG. 6B, it can be seen that when the mask 692 is misaligned and the opening area of the mask 692 is positioned to the left, a first organic light emitting layer 678b is not perfectly formed on the first pixel electrode 654 and a part of the first pixel electrode 654 is exposed. If a part of the first pixel electrode is exposed, a common electrode is directly deposited to the first pixel electrode, and, thus, a defective organic light emitting display device may be manufactured.

Figure 7A:
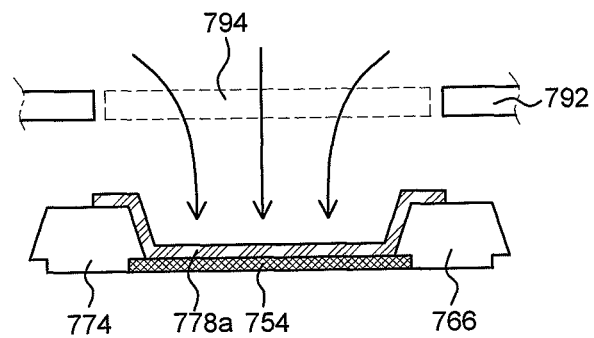
FIG. 7A and FIG. 7B are diagrams illustrating misalignment of a mask which can occur when a method for manufacturing an organic light emitting display device according to an embodiment of the present invention is used.
Figure 7B:
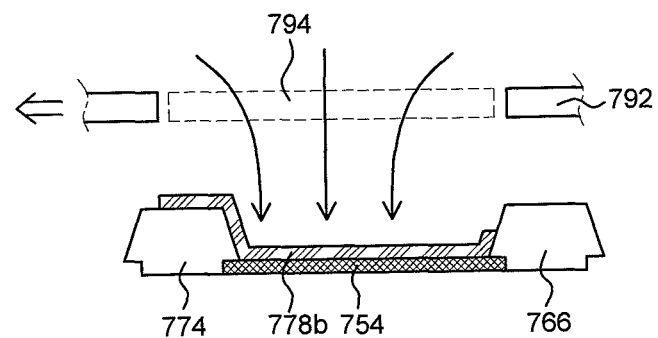

FIGS. 7A and 7B are diagrams illustrating misalignment of a mask which can occur when a method for manufacturing an organic light emitting display device according to an embodiment of the present invention is used. Referring to FIG. 7A, the method for manufacturing an organic light emitting display device according to an embodiment of the present invention includes, when an opening area 794 of a mask 792 is normally aligned, forming a first organic light emitting layer 778a on a first pixel electrode 754, a first bank layer 766, and a third bank layer 774. Referring to FIG. 7B, even if the mask 792 is misaligned and the opening area of the mask 792 is slightly positioned to the left, the first pixel electrode 754 is not exposed and manufacturing of a defective organic light emitting display device is prevented. Therefore, the method for manufacturing an organic light emitting display device according to an embodiment of the present invention can minimize the problem of manufacturing a defective organic light emitting display device caused by misalignment of a patterned mask.

Although in the above description, the organic light emitting display device according to various embodiments of the present invention has been illustrated as a top-emission organic light emitting display device, a pixel array of the organic light emitting display device according to various embodiments of the present invention can be equally applied to a bottom-emission organic light emitting display device.

Although the embodiments of the present invention have been described in detail with reference to the accompanying drawings, the present invention is not limited thereto and may be embodied in many different forms without departing from the technical concept of the present invention. Therefore, the embodiments of the present invention are provided for illustrative purposes only but not intended to limit the technical concept of the present invention. The scope of the technical concept of the present invention is not limited thereto. Therefore, it should be understood that the above-described embodiments are illustrative in all aspects and do not limit the present invention. The protective scope of the present invention should be construed based on the following claims, and all the technical concepts in the equivalent scope thereof should be construed as falling within the scope of the present invention.

What is claimed is:

1. An organic light emitting display (OLED) device comprising:
   a substrate;
   a first pixel electrode, a second pixel electrode, and a third pixel electrode formed on the substrate;
   a first bank layer and a second bank layer formed on the substrate; and
   a first organic light emitting layer, a second organic light emitting layer, and a third organic light emitting layer formed on the first pixel electrode, the second pixel electrode, and the third pixel electrode, respectively,
   wherein the first organic light emitting layer overlaps the second organic light emitting layer on the first bank layer,
   wherein all of an overlapping portion of the first organic light emitting layer and an overlapping portion of the second organic light emitting layer are directly above the first bank layer, and
   wherein all of the overlapping portions of the first and second organic light emitting layers are not directly above either of the first or second pixel electrode.

2. The OLED device according to claim 1, wherein the first organic light emitting layer overlaps the third organic light emitting layer on the second bank layer.

3. The OLED device according to claim 2, wherein the first pixel electrode and the second pixel electrode correspond to a first sub-pixel area and a second sub-pixel area respectively, and
   wherein the first organic light emitting layer overlaps the second organic light emitting layer in a first bank area corresponding to the first bank layer.

4. The OLED device according to claim 1, wherein the first organic light emitting layer overlapping the second organic light emitting layer on the first bank layer emits Hat of a shorter wavelength than light emitted by the second organic light emitting layer.

5. The OLED device according to claim 1, wherein the first organic light emitting layer overlapping the second organic light emitting layer on the first bank layer emits light of a longer wavelength than light emitted by the second organic light emitting layer.

6. The OLED device according to claim 1, wherein, on the first bank layer, the first organic light emitting layer is under the second organic light emitting layer.

7. The OLED device according to claim 1, Wherein the first pixel electrode, the second pixel electrode, and the third pixel electrode are in a first sub-pixel area, a second sub-pixel area, and a third sub-pixel area, respectively,
   wherein the first bank layer and the second bank layer are in a first bank area and a second bank area, respectively,
   wherein the first organic light emitting layer overlaps the second organic light emitting layer in the first bank area, and
   wherein the first organic light emitting layer overlaps the third organic light emitting layer in the second bank area.

8. The OLED device according to claim 7, wherein, in the first bank area, the first organic light emitting layer is under the second organic light emitting layer, and wherein, in the second bank area, the first organic light emitting layer is under the third organic light emitting layer.

9. The OLED device according to claim 7, wherein, in the first bank area, the first organic light emitting layer is between the second organic light emitting layer and the first bank layer, and wherein, in the second bank area, the first organic light emitting layer is between the third organic light emitting layer and the second bank layer.

10. The OLED device according to claim 1, wherein each of the first sub-pixel area, the second sub-pixel area, and the third sub-pixel area emits any one of a red light, a green light, and a blue light.

11. The OLED device according to claim 1, further comprising:

a fourth pixel electrode formed on the substrate, wherein the first pixel electrode, the second pixel electrode, the third pixel electrode, and the fourth pixel electrode are in a first sub-pixel area, a second sub-pixel area, a third sub-pixel area, and a fourth sub-pixel area, respectively, and wherein the fourth sub-pixel area is configured to emit a light of a same color as the second sub-pixel area.

12. The OLED device according to claim 11, further comprising:

a third bank area configured to separate the third and fourth sub-pixel areas, wherein the fourth organic light emitting layer is disposed in an entirety of the fourth sub-pixel area and the third bank area.

13. An organic light emitting display (OLED) device comprising:

a plurality of sub-pixels; and an organic light emitting layer in each of the plurality of sub-pixels, wherein each of the organic light emitting layers respectively corresponding to two adjacent sub-pixels form an overlap on a bank layer located between the two adjacent sub-pixels to separate the two adjacent sub-pixels and minimize emission energy differences between the two adjacent sub-pixels or adjacent pixels that respectively include the two adjacent sub-pixels, wherein all of an overlapping portion of a first of the organic light emitting layers and an overlapping portion of a second of the organic light emitting layers are above the bank layer in a vertical direction, and wherein all of the overlapping portions of the first and second organic light emitting layers are not above, in a vertical direction, either of a first pixel electrode in a first of the two adjacent sub-pixels or a second pixel electrode in a second of the two adjacent sub-pixels.

14. The OLED device according to claim 13, wherein the overlap includes a first of the organic light emitting layers having a shorter wavelength on top of a second of the organic light emitting layers having a longer wavelength.

15. The OLED device according to claim 14, wherein a length of the overlap depends on at least one of panel resolution, pixel pitch, pixel size, aperture ratio, and process variation.

16. A method of manufacturing an organic light emitting display (OLED) device, the method comprising:

forming a first pixel electrode, a second pixel electrode, and a third pixel electrode on a substrate;

forming a first bank layer and a second bank layer on the substrate; and forming a first organic light emitting layer; a second organic light emitting layer, and a third organic light emitting layer on the first pixel electrode, the second pixel electrode, and the third pixel electrode, respectively, wherein the first organic light emitting layer overlaps the second organic light emitting layer on the first bank layer, wherein all of an overlapping portion of the first organic light emitting layer and an overlapping portion of the second organic light emitting layer are above the first bank layer in a vertical direction, and wherein all of the overlapping portions of the first and second organic light emitting layers are not above either of the first or second pixel electrode in a vertical direction.

17. The method according to claim 16, wherein the first organic light emitting layer overlaps the third organic light emitting layer on the second bank layer.

18. The method according to claim 17, wherein the first organic light emitting layer overlapping the second organic light emitting layer on the first bank layer emits light of a shorter wavelength than light emitted by the second organic light emitting layer.

19. The method according to claim 18, wherein on the first bank layer, the first organic Slight emitting layer is under the second organic light emitting layer.

20. The method according to claim 16, wherein the first pixel electrode, the second pixel electrode, and the third pixel electrode are in a first sub-pixel area, a second sub-pixel area, and a third sub-pixel area, respectively, wherein the first bank layer and the second bank layer are in a first bank area and a second bank area, respectively, wherein the first organic light emitting layer overlaps the second organic light emitting layer in the first bank area, and wherein the first organic light emitting layer overlaps the third organic light emitting layer in the second bank area.

* * * * *